United States Patent [19]

Parry et al.

[11] Patent Number: 5,247,735

[45] Date of Patent: Sep. 28, 1993

[54] ELECTRICAL WIRE DELETION

[75] Inventors: Donovan A. Parry, Rochester; Robert J. Reis, Winona, both of Minn.

[73] Assignee: International Business Machines Corporation, Armonk, N.Y.

[21] Appl. No.: 809,901

[22] Filed: Dec. 18, 1991

[51] Int. Cl.⁵ .............................. H05K 3/02
[52] U.S. Cl. ........................ 29/847; 29/846
[58] Field of Search ............... 29/847, 846; 219/68

[56] References Cited

U.S. PATENT DOCUMENTS

| | | | |
|---|---|---|---|
| 3,028,659 | 4/1962 | Chow et al. | 29/847 |
| 3,290,757 | 3/1963 | Tanck . | |
| 3,378,920 | 4/1968 | Cone | 29/847 |
| 3,384,879 | 5/1968 | Stahl et al. | 29/847 |
| 3,548,494 | 12/1970 | Haring | 29/847 |
| 3,555,365 | 1/1971 | Forlani et al. | 29/847 |
| 4,652,974 | 3/1987 | Ryan . | |
| 4,667,404 | 5/1987 | Reisman et al. . | |

FOREIGN PATENT DOCUMENTS 0140112  5/1985  European Pat. Off. .
2550045  2/1985  France .

OTHER PUBLICATIONS

IBM Technical Disclosure Bulletin, vol. 9, No. 1, Jun. 1966, p. 112, "Printed Circuit Deletion Technique" by S. S. Huang et al.

IBM Technical Disclosure Bulletin, vol. 24, No. 12, May 1982, pp. 6383–6384, "Printed Circuit Deletion Using Capacitor Discharge" by J. Funari et al.

Primary Examiner—Mark Rosenbaum
Assistant Examiner—David P. Bryant
Attorney, Agent, or Firm—Roy W. Truelson; Paul L. Sjoquist

[57] ABSTRACT

A method of removing conductors in inner layers of circuit boards by applying a constant heating current for a predetermined time period, and then applying an increasing-magnitude current until the conductor vaporizes.

8 Claims, 3 Drawing Sheets

ELECTRICAL WIRE DELETION

BACKGROUND OF THE INVENTION

The present invention relates to a method for rework of a printed circuit board; more particularly, the method relates to a method for removing an unwanted electrical printed circuit board conductor from a printed circuit board being reworked.

The problem of repair and rework involving changes to printed circuit board wiring becomes more difficult as printed circuit boards become increasingly miniaturized, and increasingly formed of multiple layers. Miniaturization of printed circuit boards leads to extremely narrow conductor paths, with very close conductor spacing. Constructing printed circuit boards in multiple layers compounds the problem of accessing conductors embedded several layers deep into the circuit board.

In the prior art, removal of existing printed circuit board conductors during the rework process involved cutting the unwanted conductors at particular locations utilizing a sharpened knife, or utilizing specialized cutting tools. Because of the close tolerancing of adjacent conductors on printed circuit boards, specialized tools such as dental drills and precision cutting wheels have been used for this purpose. In some cases, for example, it has been possible to cut through an underlayer conductor with a dental drill without harming either adjacent conductors or conductors on adjacent layers. However, the rework process in this regard has become much more difficult as the density of circuit board wiring is increased, and the miniaturization of the circuits has increased.

Of course, it is possible to custom design printed circuit boards with the idea of subsequently and intentionally removing conductors, as by way of custom designing conductors having special fusible links built therein. However, this practice relates to the problem of designing custom circuit boards which may subsequently be customized for special purposes, and does not relate to the more general problem of reworking conventionally designed circuit boards. In a conventionally designed circuit board the multiple layers of conductors are laid out to accomplish a specific circuit design function, and no attention has been given to any need for subsequently removing these conductors. Therefore, when rework is attempted on such circuit boards there are no built-in design features to facilitate the rework, and the only tools available for such rework have been precision cutting tools.

It would be an advantage to have a method for reworking printed circuit board conductive paths without the necessity of imposing certain design requirements on the construction of the initial printed circuit board, or without the need to employ precision cutting instruments. The present invention overcomes these difficulties by providing a method for selectively deleting printed circuit board conductors without regard to the techniques under which the circuit board was initially constructed.

SUMMARY OF THE INVENTION

The present invention provides a method for deleting circuit board conductors by application of a predetermined, multiple-step process. The process comprises an initial application of an idle current magnitude for a predetermined length of time to heat the conductor and its surrounding area; next, the heating process results in oxygen becoming released from the circuit board epoxy materials surrounding the conductor; last, the magnitude of the current applied to the conductor is linearly increased at a predetermined rate, to reach the ignition point of the conductor and to instantaneously vaporize the entire length of conductor in a sudden and instantaneous action. In addition, energy is applied directly to the copper only, and the heating of the surrounding material is by conduction. This technique can be applied to unpopulated boards (i.e., without components) or, with appropriate clamping circuits, to populated boards.

It is therefore a principal object and feature of the present invention to provide an enhanced method for reworking a printed circuit board.

It is another object and feature of the present invention to provide an enhanced method for deleting circuit board conductors by application of a multiple-step heating process.

It is another advantage and feature of the invention to provide an enhanced method for deleting printed circuit board conductors embedded within multiple-layer circuit boards.

It is a further advantage and feature of the present invention to provide an enhanced method for eliminating circuit board conductors by vaporization of the entire conductor segment between two points where the heating process is applied.

It is a further advantage and feature of the present invention to reduce the cost of reworking printed circuit boards.

Other and further objects, advantages and features of the invention will become apparent from the following specification and claims, and with reference to the appended drawings.

DESCRIPTION OF THE PREFERRED EMBODIMENT

Figure 1:
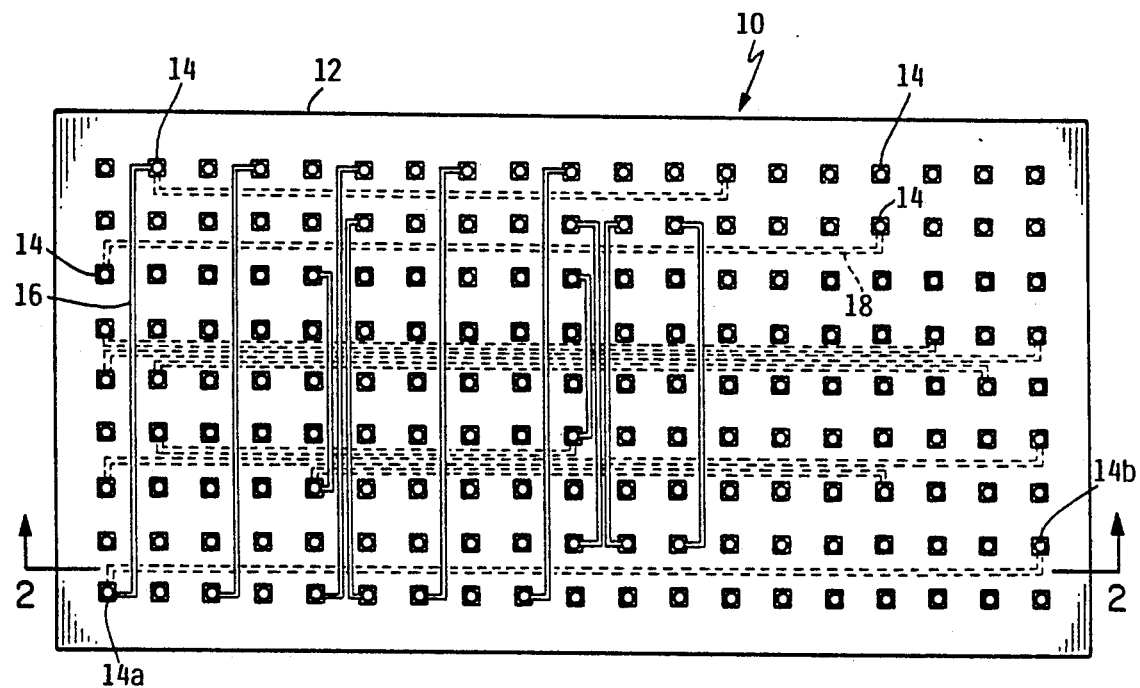
FIG. 1 shows a top view of a printed circuit board having a single embedded conductor layer.

Referring first to FIG. 1, there is shown a top view of a printed circuit board 10 which is intended to be representative of a great many forms and constructions of such structures. The circuit board 10 is constructed of one or more layers of an epoxy or sheet material 12, with various conductors embedded between epoxy layers and/or exposed to the top or bottom surface of sheet 12. For example, a plurality of plated through conductor posts 14 may be arranged about the circuit board 10, either in a geometric alignment as illustrated in FIG. 1, or in some other arrangement. A plurality of conductive paths 16 may be affixed on the top surface of sheet 12, extending between various conductive posts 14. Similarly, a plurality of conductive paths 18 may be embedded in the interior layers of circuit board 10, and may extend between various conductive posts 14. Conductive paths 18 which are buried within one or more layers of circuit board 10 are in all events electrically and conductively coupled to a post 14 which extends through circuit board 10 to become exposed at an upper and/or lower surface of circuit board 10.

Figure 2:
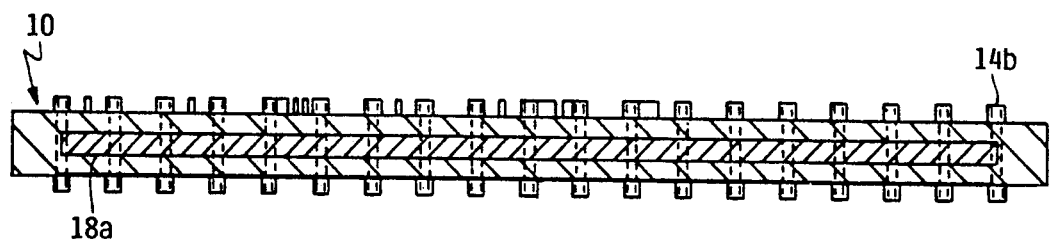
FIG. 2 shows a cross-section view taken along the lines 2—2 of FIG. 1.
Figure 3:
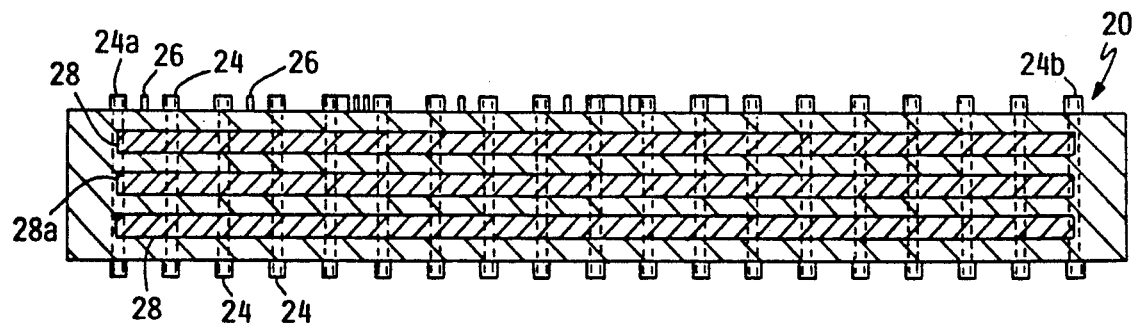
FIG. 3 shows a cross-section view of a printed circuit board having multiple conductor layers.

FIG. 2 shows a cross-sectional view taken along the lines 2—2 of FIG. 1 to illustrate the layered construction of circuit board 10. The height dimension of the view shown in FIG. 2 is greatly exaggerated relative to the width dimension, to more clearly show the conductor segments which are associated with its construction. For example, an elongated buried conductor path 18a is illustrated, extending between a plated through post 14a and 14b. In actual practice, the thickness of conductor path 18a is typically about 0.0014 inch (1.4 mils), and the height of the respective conductive posts and conductive paths which extend above and/or below the board surfaces is also about 1.4 mils. The overall thickness of circuit board 10, including the surface conductors and posts, is between 25 mils and 100 mils, with 40 mils being typical FIG. 3 shows a cross-section view of a printed circuit board 20, having a plurality of plated conductive posts 24, a plurality of surface conductors 26, and a plurality of conductors 28 embedded within the various layers of circuit board 20. Conductive path 28a extends between conductive post 24a and 24b, along an internal layer which is approximately centered within circuit board 20. Other conductive path layers may be found within circuit board 20 at various levels within the circuit board, to provide an increased number of potential circuit paths for interconnection between various conductive posts. However, in all cases, an internal conductor path is always connected to a conductive post which itself is exposed to either the top or bottom surface of circuit board 20. It is therefore always possible to trace an electrical circuit path through circuit board 20 through the use of an ohm-meter or other similar device, by making electrical contact between two different electrical posts 24. Electrical circuit continuity can be established thereby, to enable one to determine the end points of any internal electrical conductive path. It should be pointed out that the vertical dimension of FIG. 3 is greatly exaggerated relative to the horizontal dimension, to illustrate the relative layers of conductors and insulators which appear within the circuit board. An actual multi-layer printed circuit board of the type illustrated in FIG. 3 will be approximately 50 mils or less in thickness, including the exposed surface conductors on either side of the board.

Figure 4:
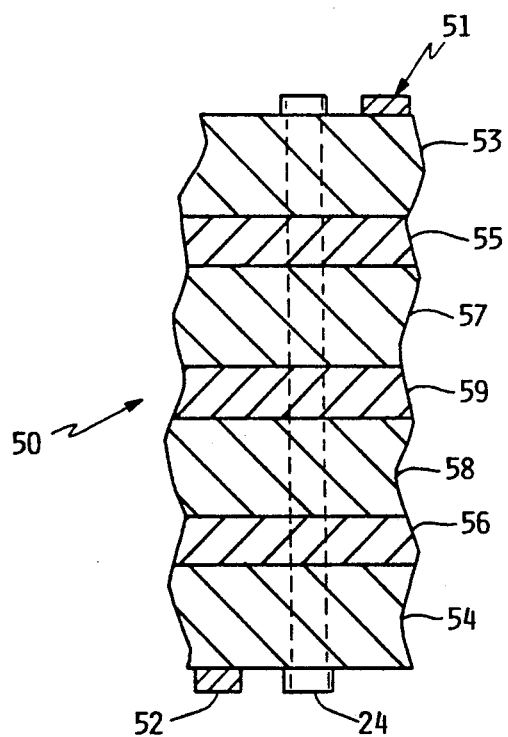
FIG. 4 shows an enlarged cross-section view of a portion of a multi-layer circuit board.

FIG. 4 shows an expanded partial cross-sectional view of a representative circuit board 50 having multiple layers, illustrating and identifying the respective layers associated with the circuit board. Circuit board 50 may have exposed conductors 51 and 52 on respective surfaces of the circuit board. These exposed conductors are typically 1.4 mils in thickness, and may range between 4-6 mils in width. The outermost surface layers 53 and 54 of printed circuit board 50 are typically made from an insulating epoxy material, and are 6 mils in thickness. Beneath these layers may be found further conductive paths 55 and 56 (corresponding to conductive paths 28), which are respectively about 1.4 mils in thickness. The next inner layers 57 and 58 are also insulating layers, typically having a thickness of about 6 mils. The central innermost layer may be a further conductive path 59. All of these layers are bonded together to form circuit board 50, which may have an overall thickness of 50 mils or less.

In practical design applications it is occasionally necessary to remove a conductive path between two conductive posts, either because of a design error or a design modification. If the conductive path lies on an external surface of the circuit board, removal may simply be a matter of selectively cutting the conductive path at convenient locations. However, if the conductive path lies within an internal layer of the circuit board, it is extremely difficult to access the conductive path for cutting. In the prior art, various drilling and laser cutting techniques have been attempted for this purpose, but the increased packing density found on circuit boards makes cutting operations extremely difficult to achieve. The present invention overcomes this difficulty by application of the novel process described herein.

It has been found that conductive paths at any layer within a printed circuit board may be removed by a heating process as herein described. First, the end points of the conductive path are identified by electrical continuity measurements or by other means. Once the end points have been established, the conductive posts are thereby identified wherein the conductive path is electrically coupled. An idle current is applied to the conductive posts and flows through the conductive path within the circuit board. It has been found that an idle current of about 3-4 amperes, applied for a time of approximately two seconds, will heat the conductive path and its surrounding area to an elevated temperature, thereby releasing oxygen molecules from the epoxy material which surrounds the conductive path embedded in the circuit board. The next step of the process is to increase the idle current, preferably by a linearly increasing ramp, at the rate of approximately 10 amps per second, to a maximum current flow of 35 amperes. The increasing ramp is applied until the conductive path ignites, which effect is observable by smoke, sound and illumination. The ignition event usually occurs within about two seconds after application of the ramping current, and the ignition of the conductive path completely vaporizes the conductor between the conductive posts where the current has been applied. It has been observed that this process creates at least one venting site along the conductive path, which can be detected as a small breakthrough from the conductive path layer to the external surface of the circuit board, and is typically 20-30 mils across. The gases resulting from the vaporization are released through these one or more venting sites, and a cross-sectional examination of the conductive path thus processed will review a tunnel where the conductive path previously existed.

Figure 5:
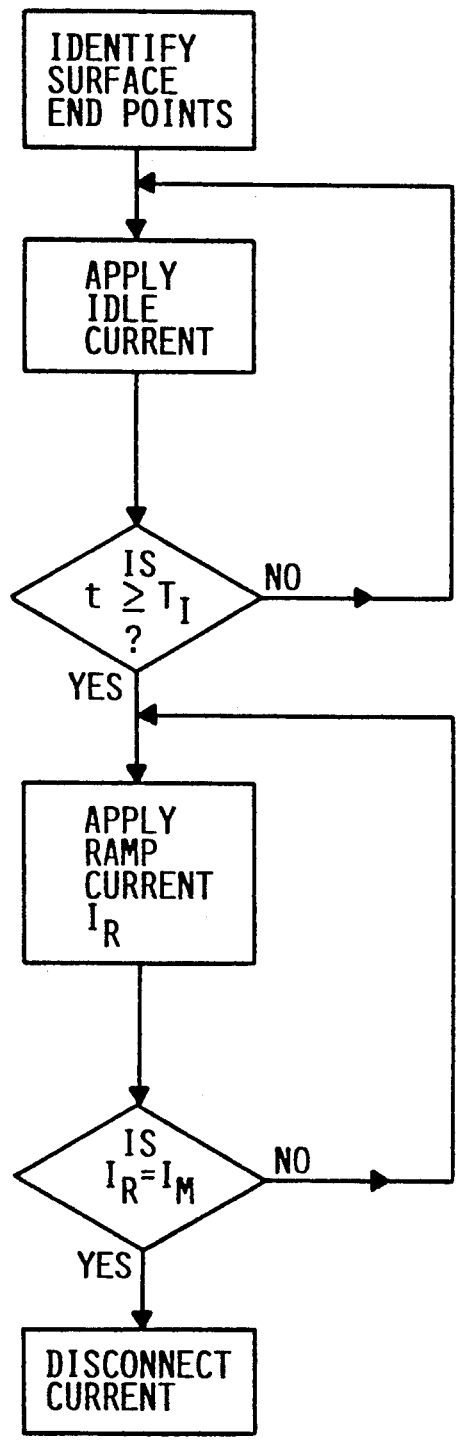
FIG. 5 shows a flow chart of the removal method.

The foregoing process is illustrated in flow chart form in FIG. 5. First, the surface end points are identified to establish a conductivity path through the conductor which is to be removed. Next, an idle current is applied for a time period $T_I$. At the end of the time period $T_I$ a ramp current $I_R$ is applied. Preferably, this ramp current increases at the rate of approximately 10 amperes per second, until the maximum ignition current $I_M$ is reached. At this point, the affect of current $I_M$ is physically realized by observation of the circuit board. Typically, a light flash occurs which is accompanied by a sound "pop," and the vaporization of the conductive path is instantaneous. Thereafter, the current is disconnected from the circuit board, permitting use of the board with the now-removed conductor path therein.

The process described above has been successfully applied to conductive paths having a cross-sectional area of 1.4×6 mils, wherein the conductive material is copper. In this case, the idle current value has preferably been found to be approximately 4 amperes. In the case of conductive paths having a cross-sectional dimension of 1.4×3 mils, it has been found that an idle current of approximately 3 amps is preferable. The current density required for the process, is that current density which will attain an elevated temperature in the range of 150° C.–105° C., which is just below the ignition point of the epoxy circuit board material, but sufficiently high to soften the epoxy material and to release oxygen molecules therefrom.

The use of an increasing ramp current applied to the conductive path has been found to be most preferable, as it provides a linearly increasing buildup of current until the precise vaporization point is achieved, and at the precise vaporization point causes an instantaneous vaporization which is evidenced by the emission of light, sound and gas from the venting sites which are also created. It is believed that application of a step function current would be disadvantageous to the process, for excessive currents might very well lead to damage and destruction of the circuit board, rather than to the selective vaporization of only the single conductive path along which the current ramp is applied.

Unlike many prior art rework methods, the method described herein is suitable for reworking populated boards (i.e., a board in which electrical components are soldered in place) as well as raw circuit boards without components. Because conductors on the board have a very low resistance, sufficient current to vaporize the conductor can be induced with a low voltage which will not harm existing components. The current source must contain an appropriate voltage clamping means to prevent a potentially damaging voltage spike when the conductor vaporizes; it is preferred that this voltage be clamped at about 0.5 volts.

It has been seen that the method may be applied satisfactorily to conductors on the surface of the printed circuit board as well as conductors buried within inner layers of the circuit board. However, the method has appeared to work better for severing connections of interlayer circuit board conductors.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A method of reworking a printed circuit board by deleting an electrically conductive path from said board, said board comprising a plurality of electrical conductors establishing a plurality of electrically conductive paths, said method comprising the steps of:
   identifying the end points of an electrically conductive path to be deleted; and
   causing sufficient electrical current to flow in said electrically conductive path to be deleted, to sever said electrically conductive path, wherein said step of causing sufficient electrical current to flow in said electrically conductive path comprises the steps of applying a current to said end points to head said electrically conductive path, and increasing said current at a predetermined rate, until said conductor undergoes instantaneous vaporization.

2. The method of claim 1, wherein said step of applying a current to said end points to heat said conductive path comprises applying a current of 3 to 4 amps for approximately 2 seconds.

3. The method of claim 2, wherein said step of increasing said current at a predetermined rate comprises increasing said current at a rate of approximately 10 amperes per second.

4. The method of claim 1, wherein said step of increasing said current at a predetermined rate comprises increasing said current at a rate of approximately 10 amperes per second.

5. A method of reworking a printed circuit board having a plurality of layers of conductors by removing an inner layer conductor from said printed circuit board, where said inner layer conductor is connected to posts exposed to the circuit board surface, said method comprising the steps of:
   a) identifying the posts connected to end points of said inner layer conductor;
   b) applying a current to said identified posts to heat said conductor; and
   c) increasing said current at a predetermined rate, until said conductor undergoes instantaneous vaporization.

6. The method of claim 5, wherein step b) further comprises applying a direct current of 3 to 4 amps for approximately 2 seconds.

7. The method of claim 6, wherein step c) further comprises increasing said current at the rate of approximately 10 amperes per second.

8. The method of claim 5, wherein step c) further comprises increasing said current at the rate of approximately 10 amperes per second.

* * * * *